US008037996B2

(12) United States Patent
Cheng et al.

(10) Patent No.: US 8,037,996 B2
(45) Date of Patent: Oct. 18, 2011

(54) TRANSFER APPARATUS FOR HANDLING ELECTRONIC COMPONENTS

(75) Inventors: Chi Wah Cheng, New Territories (HK); Wang Lung Tse, North Point (HK); Chi Hang Leung, Kowloon (HK)

(73) Assignee: ASM Assembly Automation Ltd, Hong Kong (HK)

( * ) Notice: Subject to any disclaimer, the term of this patent is extended or adjusted under 35 U.S.C. 154(b) by 99 days.

(21) Appl. No.: 12/348,508

(22) Filed: Jan. 5, 2009

(65) Prior Publication Data

US 2010/0172734 A1   Jul. 8, 2010

(51) Int. Cl.
*B65G 25/00* (2006.01)

(52) U.S. Cl. ............... 198/468.3; 198/468.4; 414/752.1; 414/226.01

(58) Field of Classification Search ............... 198/468.2, 198/468.3, 468.4; 414/752.1, 226.01
See application file for complete search history.

(56) References Cited

U.S. PATENT DOCUMENTS

| | | | | |
|---|---|---|---|---|
| 3,060,660 A | * | 10/1962 | Reading | 53/246 |
| 3,272,360 A | * | 9/1966 | Van Der Schoot | 414/416.02 |
| 3,412,871 A | * | 11/1968 | Lohmeier, Jr. et al. | 414/736 |
| 3,506,140 A | * | 4/1970 | Koch et al. | 414/736 |
| 3,774,778 A | * | 11/1973 | Flaig | 414/591 |
| 3,805,943 A | * | 4/1974 | Warren | 198/412 |
| 3,991,885 A | * | 11/1976 | Warren | 198/468.3 |
| 4,039,088 A | * | 8/1977 | Marynissen | 198/468.3 |
| 4,648,786 A | * | 3/1987 | Sakurai | 198/468.3 |
| 5,575,376 A | * | 11/1996 | Colamussi | 198/468.3 |
| 5,643,619 A | * | 7/1997 | Oas et al. | 425/534 |
| 5,931,279 A | * | 8/1999 | Pedrotto et al. | 198/468.3 |
| 6,131,721 A | * | 10/2000 | Arakawa et al. | 198/468.3 |
| 6,199,680 B1 | * | 3/2001 | Sakai et al. | 198/419.2 |
| 6,217,093 B1 | * | 4/2001 | Neutel et al. | 294/87.1 |
| 6,336,548 B1 | * | 1/2002 | Asai et al. | 198/468.4 |
| 6,446,354 B1 | | 9/2002 | Na | |
| 6,618,633 B1 | * | 9/2003 | Gooch et al. | 700/59 |
| 6,655,045 B2 | | 12/2003 | Cheung et al. | |
| 6,971,838 B2 | * | 12/2005 | Johnson et al. | 414/796.7 |
| 7,134,833 B2 | * | 11/2006 | de Koning | 414/753.1 |
| 7,190,446 B2 | | 3/2007 | Cheng et al. | |
| 7,390,040 B2 | * | 6/2008 | Subotincic | 294/65 |
| 7,464,807 B2 | * | 12/2008 | Ham et al. | 198/468.3 |
| 7,621,039 B2 | * | 11/2009 | Lee et al. | 29/740 |
| 7,690,706 B2 | * | 4/2010 | Wild et al. | 294/65 |
| 2006/0182585 A1 | | 8/2006 | Lee et al. | 414/609 |

FOREIGN PATENT DOCUMENTS

JP   9-214186   8/1997

* cited by examiner

*Primary Examiner* — Joseph A Dillon, Jr.
(74) *Attorney, Agent, or Firm* — Ostrolenk Faber LLP (57) ABSTRACT

An apparatus for transferring a plurality of electronic components includes a row of pick heads operative to pick up the electronic components simultaneously from a first location and to place them at a second location. Additionally, there is a driving mechanism operative to drive the pick heads to move relative to one another in directions which are parallel to a length of the row of pick heads whereby to adjust a pitch width of the pick heads.

7 Claims, 8 Drawing Sheets

TRANSFER APPARATUS FOR HANDLING ELECTRONIC COMPONENTS

FIELD OF THE INVENTION

The present invention relates to apparatus and methods for processing electronic components such as semiconductor packages, and in particular, to the singulation, inspection, sorting and offloading of the electronic components.

BACKGROUND AND PRIOR ART

The sorting of electronic components, such as packages that have been singulated on a mounting tape or a singulation jig, is one of the key back-end processes for the manufacture of Chip-Scale Packages ("CSP") like Ball Grid Array ("BGA") packages and Quad Flat No leads ("QFN") packages.

In a CSP package, there is a lead or ball side (top surface) for making electrical connections with other devices, as well as a mold side (bottom surface) comprising an encapsulant for protecting the internal circuitry. The mold side is also commonly referred to as a marking side as labels or other information may be marked onto this surface of the package. Inspection results on the lead/ball side and mold/marking side are commonly used as sorting criteria when sorting different packages that have been formed to determine whether packages have been satisfactorily assembled. Accordingly, an important performance index for a machine used for processing semiconductor packages is its inspection and sorting throughput.

Typically, after sorting and inspecting, good packages are offloaded to a container, such as a tray or tube container, and rejected packages are disposed of in a reject bin. Further, reworked units may be transferred to yet another tray or bin.

Conventional package processing machines sort and inspect the packages individually. The packages are also picked up and transferred to the various stations as well as offloaded separately. The throughput of such processing machines is significantly lowered as a result. An example of a method to pick-up and sort singulated electronic packages individually is illustrated in U.S. Pat. No. 7,190,446 entitled "System for Processing Electronic Devices". Singulated packages are individually picked up from a tape and placed onto holders at a certain segment of a rotary table. Concurrently, inspections of the packages take place at other segments of the rotary table. The packages are next rotated to a segment to be picked up individually by an offloading arm which transfers the packages separately to different offloading devices such as a tube, tray or bin, according to the inspection results. Pick-up and transfer of the packages are performed individually which slows down the sorting process. Furthermore, there is no flipping feature in order to expose the mold side for inspection. Inspection of the mold side of the package is done through a glass holder, which may render inspection results unreliable as a result of the quality of the glass and contamination through use.

Another pick-up and sorting apparatus is disclosed in U.S. Pat. No. 6,446,354 entitled "Handler System for Cutting a Semiconductor Package Device". The singulated packages are picked up by a vacuum head, washed with water and dried while being held by the vacuum head. After cleaning and drying, the packages are placed onto a hot plate having an array of small vacuum holes for further drying and lead/ball surface inspection. Half of the packages are placed onto a turntable with a buffer plate on top, with pockets arranged in an alternating format. The remaining packages are put onto the second half of the buffer plate. The buffer plate rotates when required to position the packages in a preferred orientation before being picked up by dual offloading pick arms. The packages are then picked up one at a time by multiple vacuum heads on the dual offloading pick arms which transfer the packages to a position opposite the offloading device for mark inspection. The packages are further transferred to a tray or a tube according to the inspection results. This method is undesirable as a complicated pick head design using several motors to drive individual vacuum pads in the z-direction is needed. More expensive fabrication methods are required since the motor channel includes the motor itself, encoder and a driver. Additionally, while the pick-up rate of individual packages is quite fast and flexible, it is still unable to match the speed of the saw machine for producing smaller package sizes.

In yet another prior art approach, U.S. Pat. No. 6,655,045 entitled "Apparatus and Method for Pick and Place Handling" discloses a gang transfer arm which carries the singulated packages by a gang "sliding" approach. The singulated packages are slid by a rinsing carrier from a singulation jig to a rinsing platform. Next, a drying carrier moves the washed packages further for drying on the same platform. The packages are next moved in individual rows onto a transfer track and the packages are separated into separate units to be picked up individually at the end of the track. The lead/ball surface inspection can be conducted before offloading units to either a tray, tube, reject bin, or canister according to the inspection results. As different conversion kits are required for different packages, this method involves high costs. The setup and conversion are also difficult, requiring major leveling adjustments from the singulation jig to the rinsing platform, a map separator and the transfer track. Additionally, this method limits inspection to the lead/ball surface of the packages only. Furthermore, since the packages are separated into separate units to be picked up individually at the end of the track, this reduces throughput of the sorting process.

Therefore, in order to overcome the aforesaid disadvantages in the prior art, it would be desirable to provide simple and reliable apparatus and methods for handling singulated packages in groups instead of individually and which allow full inspection of multiple sides of the packages (such as their bottom and top surfaces and four side surfaces) efficiently and cost effectively.

SUMMARY OF THE INVENTION

It is thus an object of the invention to seek to provide a transfer apparatus for a handling system for efficient pick-and-place operations of groups of singulated electronic components, while overcoming at least some of the shortcomings of the aforesaid prior art.

According to a first aspect of the invention, there is provided an apparatus for transferring a plurality of electronic components, comprising a row of pick heads operative to pick up the electronic components simultaneously from a first location and to place them at a second location, and a driving mechanism operative to drive the pick heads to move relative to one another in directions which are parallel to a length of the row of pick heads whereby to adjust a pitch width of the pick heads.

According to a second aspect of the invention, there is provided a method of transferring a plurality of electronic components, comprising the steps of simultaneously picking up the electronic components with a row of pick heads at a first location, moving the pick heads relative to one another in directions which are parallel to a length of the row of pick heads to adjust a pitch width of the pick heads, and then placing the electronic components at a second location.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiments of the invention when considered with the accompanying drawings, in which.

DETAILED DESCRIPTION OF THE PREFERRED EMBODIMENTS OF THE INVENTION

The preferred embodiments of the present invention will be described hereinafter with reference to the accompanying drawings.

Figure 1:
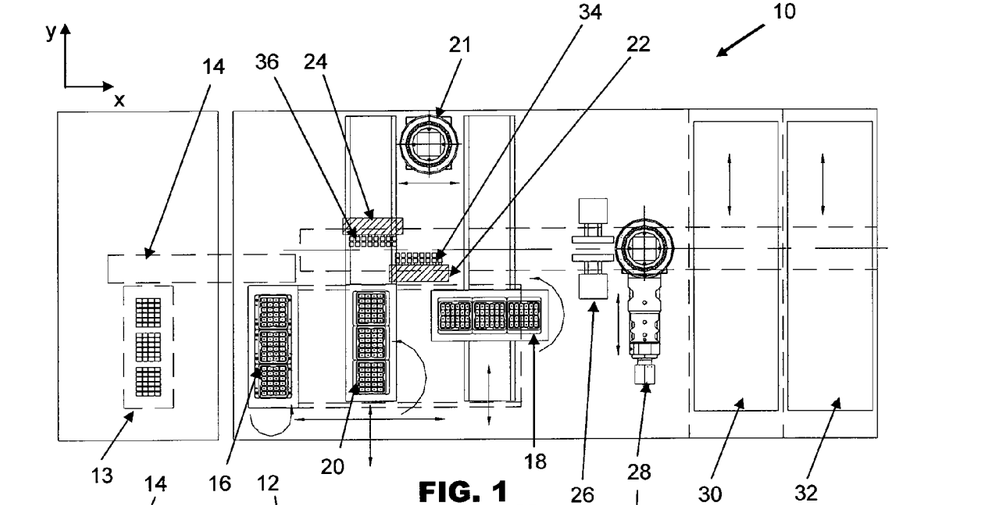
FIG. 1 is a plan view (in the x-y axes) of an inspection apparatus for sorting, inspecting and offloading singulated packages according to the preferred embodiment of the invention.
Figure 2:
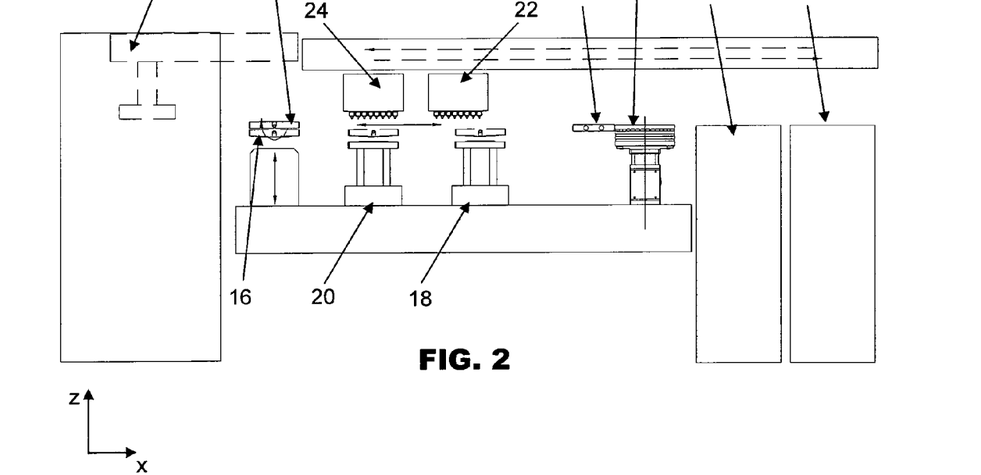
FIG. 2 is a side view (in the x-z axes) of the inspection apparatus of FIG. 1.

FIG. 1 is a plan view (in the x-y axes) of an inspection apparatus 10 for sorting, inspecting and offloading electronic components in the form of singulated packages 12 according to the preferred embodiment of the invention. FIG. 2 is a side view (in the x-z axes) of the inspection apparatus 10 of FIG. 1. The inspection apparatus 10 includes two main modules, namely the onload and front processes module and a package offload module. The onload and front processes module includes an unloading arm 14, a flipping platform 16 and package holders in the form of dual buffer boats 18, 20, each of which is configured to hold an array of packages 12. Preferably, the buffer boats 18, 20 can rotate 90°, 180° or 270° from the original orientation to suitably orientate the packages 12 for downstream processes. A first inspection station in the form of a mold surface inspection device 21 is also present. The package offload module comprises dual linear offloading arms 22, 24 for transferring a plurality of packages 12, a gang précisor 26, a second inspection station such as a ball inspection device 28 and offloaders 30, 32.

The packages 12 are singulated on a singulation jig 13 before the unloading arm 14 picks up all the singulated packages 12 from the singulation jig 13 and loads them onto the flipping platform 16 with their mold sides facing downwards. The flipping platform 16 flips the packages 12 received by 180° so that their mold sides or surfaces point upwards for inspection by the mold surface inspection device 21. It then moves in the x-direction to transfer the packages block by block onto one of the dual buffer boats 18, 20. After the buffer boats 18, 20 receive the packages 12, they transport the packages 12 with their mold surfaces pointing upwards in the y-direction to the mold surface inspection device 21 at the back of the inspection apparatus 10 for mold surface inspection. The mold surface inspection device 21 is movable in the x-direction to inspect packages 12 held on one of the buffer boats 18, 20.

After mold surface inspection, the buffer boats 18, 20 transport the packages 12 to the middle of the inspection apparatus 10 where the linear offloading arms 22, 24 are on standby to pick up the packages 12. The linear offloading arms 22, 24 comprise automatic pitch adjustment pick arms with each arm bearing a row of offloading pick heads 34, 36, each pick head including at least first and second vacuum pads 38 aligned orthogonally to a length (L, see FIG. 7) of the row of pick heads 34, 36. The row of pick heads 34, 36 is operative to pick up at least first and second rows of packages 12 from a first location such as from the buffer boats 18, 20 and place the packages 12 at a second location such as at the offloaders 30, 32.

During a pick-up sequence, the row of offloading pick heads 34, 36 picks up a first row of packages 12 with the first vacuum pads 38, moves the second row of vacuum pads 38 relative to a second row of packages 12 to be picked in a direction which is orthogonal to the length of the row of pick heads 34, 36, and then picks up the second row of the packages 12 with the second row of vacuum pads 38. The packages 12 are then transported to the gang précisor 26 for package orientation alignment to maintain angular consistency of the packages 12. All the packages 12 held by the pick heads 34, 36 on the linear offloading arms 22, 24 are aligned simultaneously by the gang précisor 26 and thereafter, the pitch between adjacent packages 12 can be adjusted as necessary by adjusting the pitch width (p, see FIG. 7) between adjacent pick heads 34, 36 in the direction of the length of the row of pick heads 34, 36. Next, the packages 12 are transported by the linear offloading arms 22, 24 to the ball inspection device 28 for inspection before the inspected packages 12 are moved to the offloaders 30, 32.

The placing of the packages 12 at the offloaders 30, 32 comprises the successive steps of placing the first row of packages 12 onto the offloaders 30, 32, moving the second row of vacuum pads 38 relative to the offloaders 30, 32 in a direction which is orthogonal to the length of the row of pick heads 34, 36, and thereafter placing the second row of packages 12 onto the offloaders 30, 32.

Figure 3A:
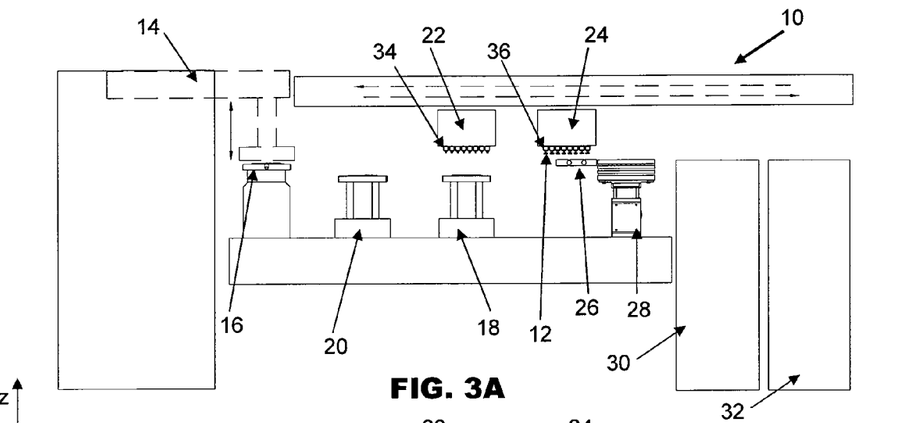
FIGS. 3A to 3I illustrate side views (in the x-z axes) of a working sequence of the transfer of the singulated packages from a flipping platform to buffer boats followed by inspection and offloading of the singulated packages to offloaders of the inspection apparatus of FIG. 1.

FIGS. 3A to 3I illustrate side views (in the x-z axes) of a working sequence of the transfer of the singulated packages 12 from the flipping platform 16 to the buffer boats 18, 20 followed by inspection and offloading of the singulated packages 12 to the offloaders 30, 32 of the inspection apparatus 10 of FIG. 1. In FIG. 3A, the unloading arm 14 transfers all the singulated packages 12 to the flipping platform 16. A first linear offloading arm 22 comprising pick heads 34 stands by above a first buffer boat 18 while a second offloading arm 24 comprising pick heads 36 which are holding the packages 12 proceeds along the x-direction to the gang précisor 26 for package alignment followed by pitch width adjustment before inspection at the inspection camera of the ball inspection device 28.

Figure 3B:
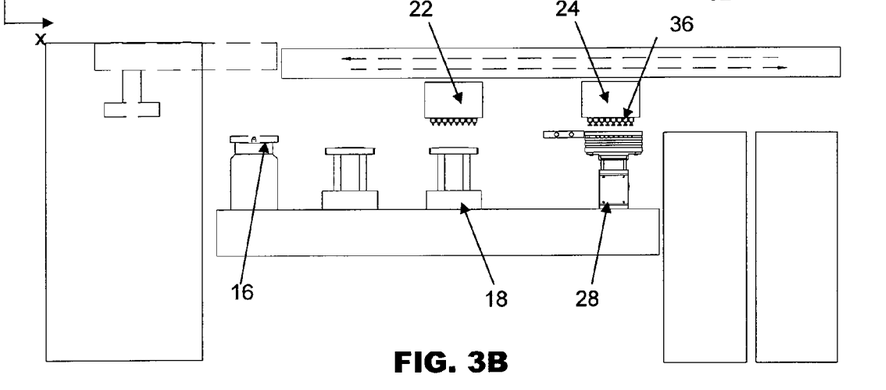

In FIG. 3B, the flipping platform 16 flips all the packages 12 on the platform such that the mold sides or surfaces of the packages 12 point upwards. The second offloading arm 24 is positioned over the inspection camera of the ball inspection device 28 for inspecting the packages 12 held by the pick heads 36. The pitch width between the pick heads 36 is adjusted so as to maximize the use of a field of view of the inspection camera before the step of inspecting the packages 12.

Figure 3C:
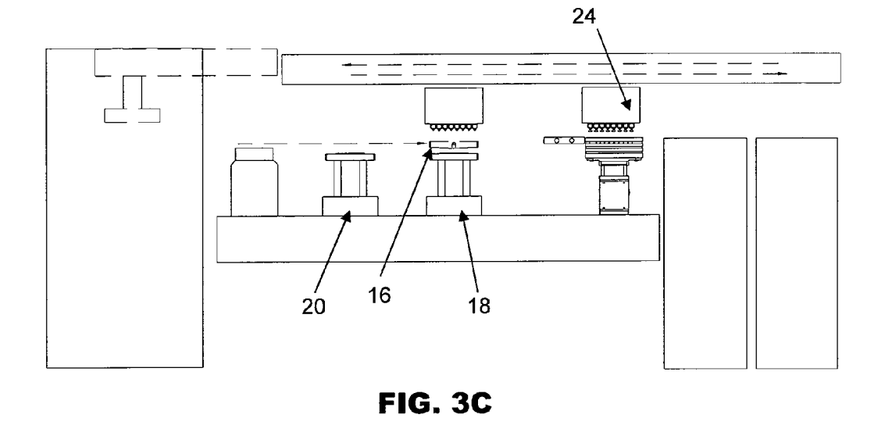

The packages 12 on the flipping platform 16 are moved to positions over one of the dual buffer boats 18, 20 in the x-direction in FIG. 3C. The flipping platform 16 is lowered onto the first buffer boat 18 which receives the singulated packages 12 from the flipping platform 16. The first buffer boat 18 proceeds in the y-direction to the mold surface inspection station 21 at the back of the inspection apparatus 10 for mold surface inspection. Inspection of the packages 12 held by the pick heads 36 of the second offloading arm 24 continues at the ball inspection device 28 with the packages 12 being inspected singly or in groups by the inspection camera.

Figure 3D:
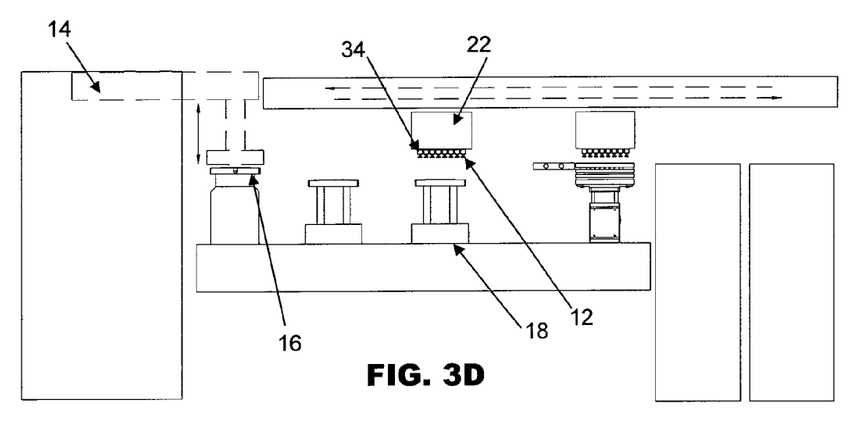

In FIG. 3D after mold surface inspection of the packages 12, the first buffer boat 18 moves along the y-axis to the middle of the inspection apparatus 10 under the first offloading arm 22 which picks up one or more rows of packages 12 with its pick heads 34. The buffer boat 18 indexes in the y-direction so that the pick heads 34 can pick up consecutive rows of packages 12 before the first offloading arm 22 proceeds along the x-direction towards the offloading stations 30, 32. The buffer boat 18 continues to index in the y-direction until every row of packages 12 has been picked up by the offloading arms 22, 24 and inspection of all the packages 12 held by the pick heads 34, 36 of the first and second offloading arms 22, 24 has been conducted at the ball inspection device 28. Simultaneously, the unloading arm 14 positions the next strip of singulated packages 12 onto the flipping platform 16.

Figure 3E:
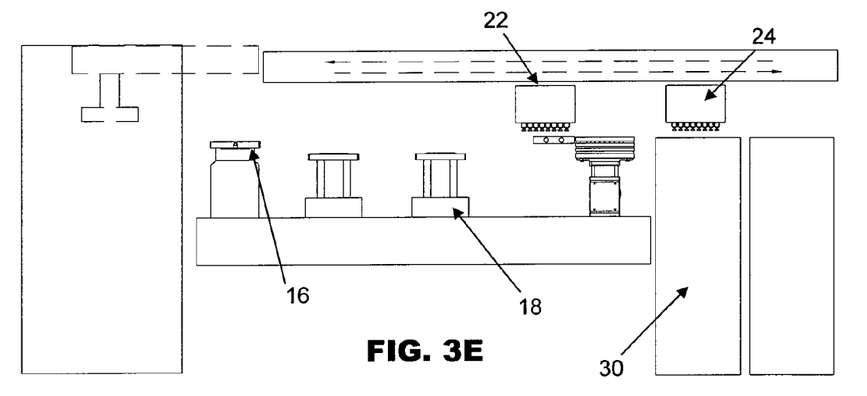

In FIG. 3E, the singulated packages 12 are flipped by the flipping platform 16. After having picked up one or more rows of packages 12 from the first buffer boat 18, the first offloading arm 22 moves to the gang précisor 26 for alignment of the packages 12 picked up. At the same time, the second offloading arm 24 has moved along the x-direction to the first offloader 30 after the inspection of the packages 12 held by the second offloading arm 24 has been completed.

Figure 3F:
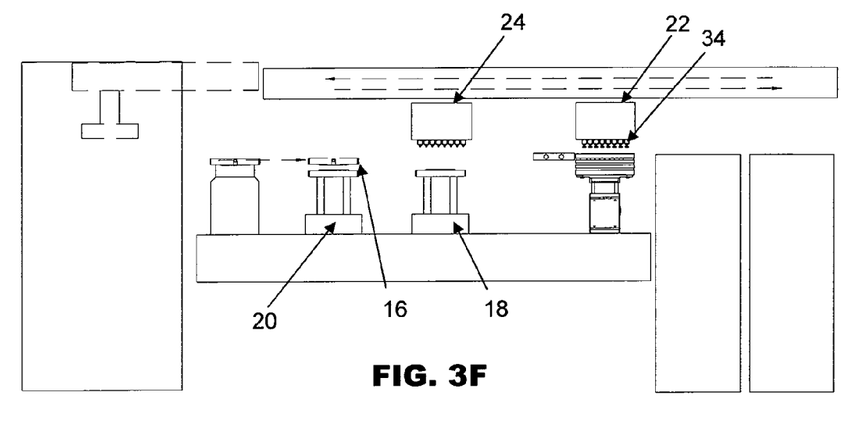

In FIG. 3F, the flipped packages 12 are transferred to the second buffer boat 20 ready for transportation to the mold surface inspection station 21 at the back of the inspection apparatus 10 for mold surface inspection. The first offloading arm 22 proceeds along the x-direction to the ball inspection device 28 for the inspection of the packages 12 held on the pick heads 34. In the meantime, the second offloading arm 24 moves to the first buffer boat 18 to pick up another one or more rows of packages 12 from the buffer boat 18.

Figure 3G:
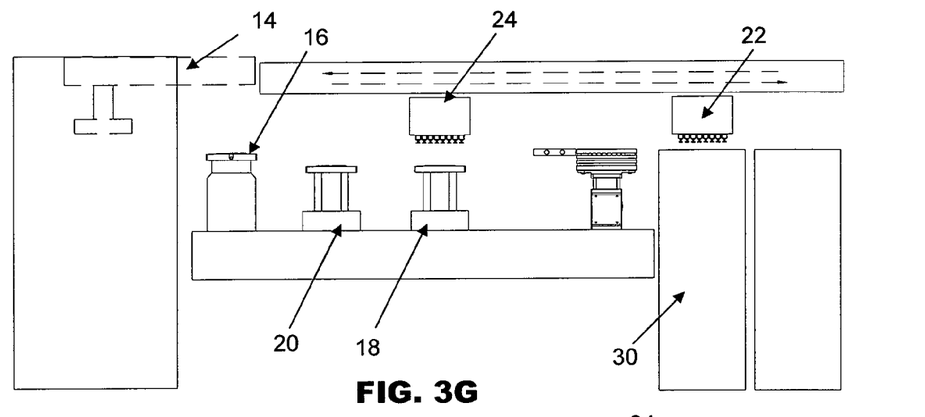

In FIG. 3G, the flipping platform 16 receives the next group of singulated packages 12 from the unloading arm 14. The dual offloading arms 22, 24 pick up all the packages 12 on the first buffer boat 18 before picking the packages 12 from the second buffer boat 20. The second offloading arm 24 picks up at least one row of packages 12 from the first buffer boat 18. In the meantime, the packages 12 on the buffer boat 20 are transported to the mold surface inspection station 21 for inspection. The first offloading arm 22 moves to the offloader 30 and proceeds to place the packages 12 into different offloading devices according to the inspection results.

Figure 3H:
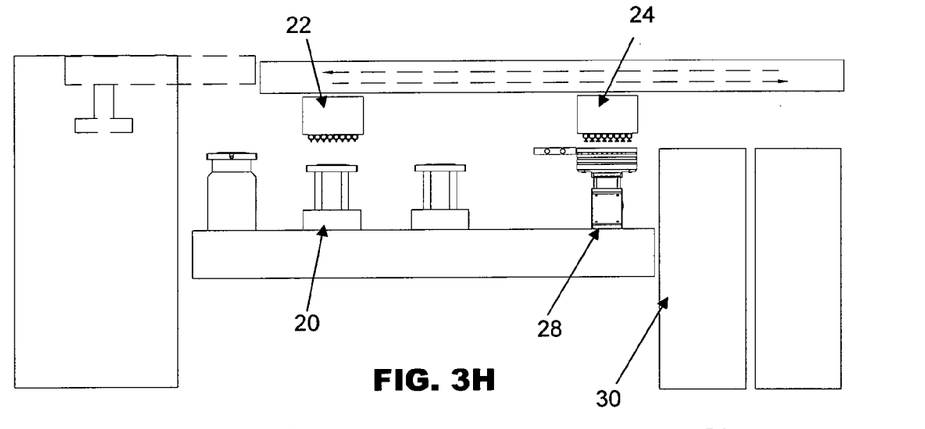
Figure 3I:
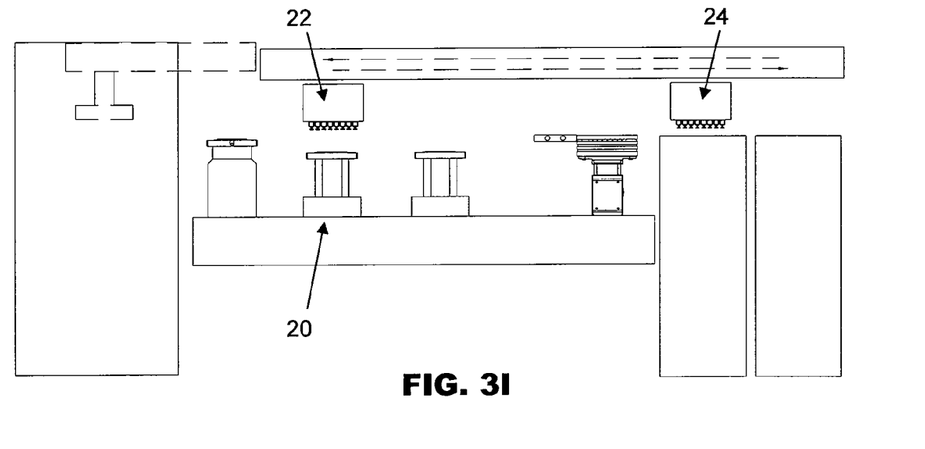

In FIG. 3H, the second buffer boat 20 transports the packages 12 to the middle of the inspection apparatus 10 after inspection by the mold surface inspection device 21. The first offloading arm 22 is positioned over the buffer boat 20 ready to pick up another one or more rows of packages 12 while the packages 12 held by the second offloading arm 24 are inspected at the ball inspection device 28. In FIG. 3I, the packages 12 on the second offloading arm 24 are unloaded to the offloader 30 while at least one row of the packages 12 has been picked up by the first offloading arm 22 for inspection and offloading. The cycle from FIGS. 3A to 3I is repeated when the unloading arm 14 receives a new strip of singulated packages 12.

Figure 4A:
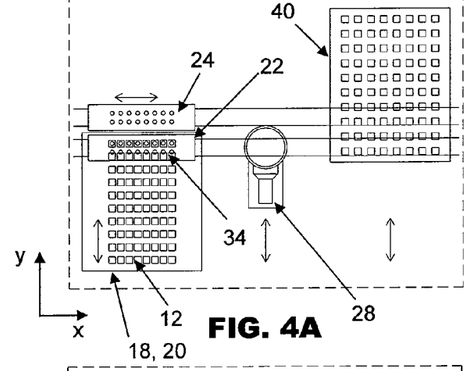
FIGS. 4A to 4F illustrate plan views (in the x-y axes) of a working sequence of the transfer of singulated packages from the buffer boat to a first preferred embodiment of the offloader in the form of an offload tray.

FIGS. 4A to 4F illustrate plan views (in the x-y axes) of a working sequence of the transfer of singulated packages 12 from the buffer boat 18, 20 to a first preferred embodiment of the offloader in the form of an offload tray 40. In FIG. 4A, a first row vacuum pads of the pick heads 34 on the first linear offloading arm 22 picks up a first row of singulated packages 12 from one of the buffer boats 18, 20.

Figure 4B:
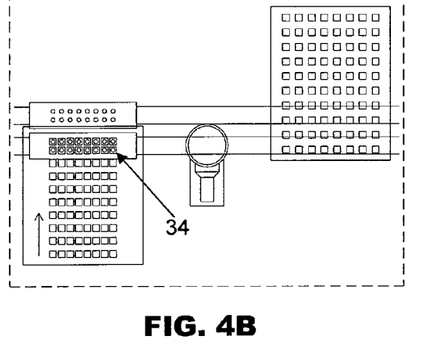
Figure 4C:
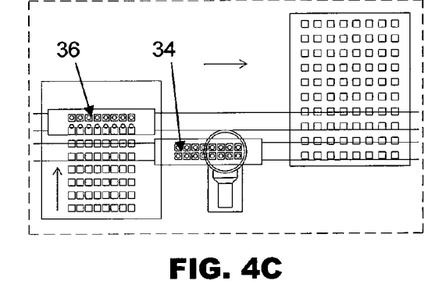
Figure 4D:
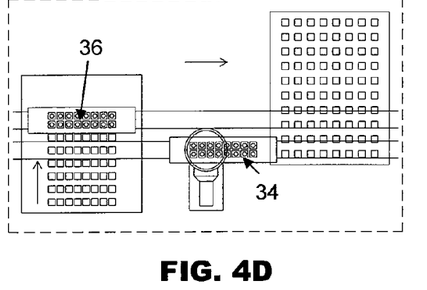

In FIG. 4B, the buffer boat 18, 20 indexes in the y-direction to a position under a second row of vacuum pads of the pick heads 34. The second row of vacuum pads on the pick heads 34 pick up another row of packages 12. In FIG. 4C, the first pick heads 34 move over the ball inspection device 28 for inspection of the packages 12 held on the pick heads 34 either singly or in groups. The pitch width of the vacuum pads 38 and hence the pick heads 34 held by the vacuum pads 38 are adjusted to make the most efficient use of the field of view of the inspection camera. At the same time, the second pick heads 36 pick up a first row of packages 12 on the dual buffer boats 18, 20. In FIG. 4D, the remaining packages 12 held by the first pick heads 34 continue to be inspected singly or in groups while the second pick heads 36 pick up a second row of packages 12 from the buffer boat 18, 20.

Figure 4E:
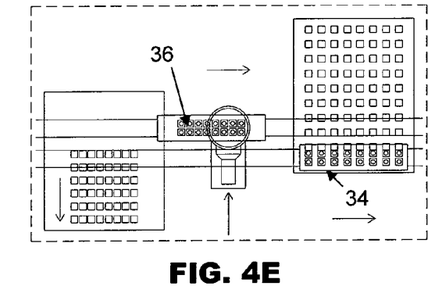
Figure 4F:
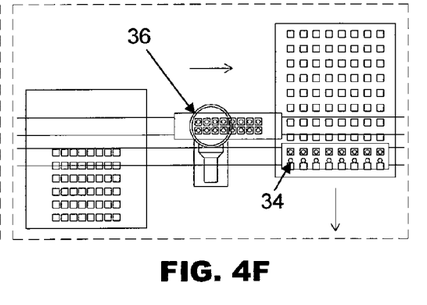

In FIG. 4E, the first pick heads 34 move to the offload tray 40 on one of the offloaders 30, 32 to place the first row of packages 12 into the tray 40. Placement of the packages 12 in rows is possible since the pitch width of the pick heads 34 may be adjusted to correspond with a pitch width of the pockets of the tray 40 or other offload media. In FIG. 4F, the offload tray 40 indexes in the y-direction so as to receive the second row of packages 12 from the first pick heads 34. At the same time, inspection and pitch adjustment of the remaining packages 12 held on the second pick heads 36 are conducted at the ball inspection device 28. The sequence from FIGS. 4A to 4F is repeated for the next buffer boat 18, 20 after all the packages 12 have been offloaded.

Figure 5A:
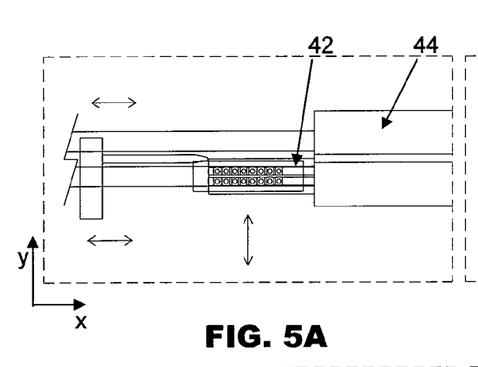
FIGS. 5A to 5F illustrate plan views (in the x-y axes) of the transfer of singulated packages to a second preferred embodiment of the offloader in the form of an offload tube.
Figure 5B:
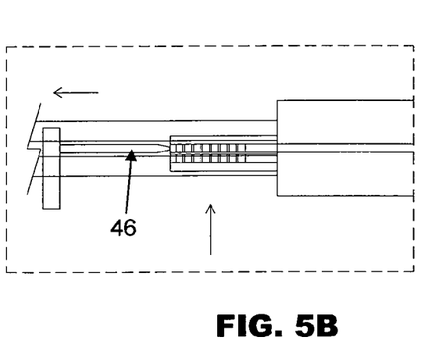
Figure 5C:
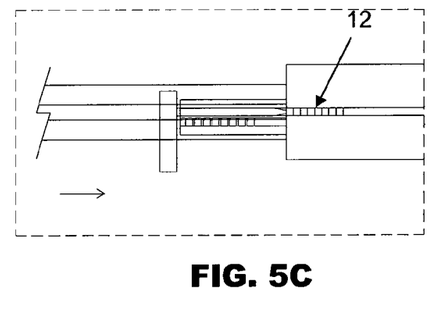
Figure 5D:
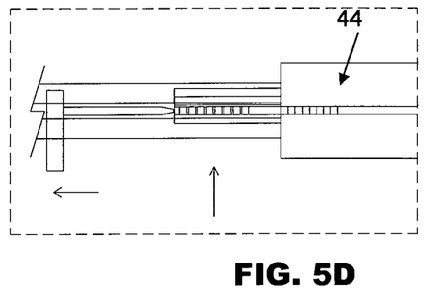
Figure 5E:
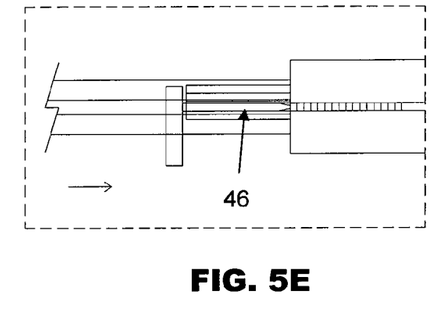
Figure 5F:
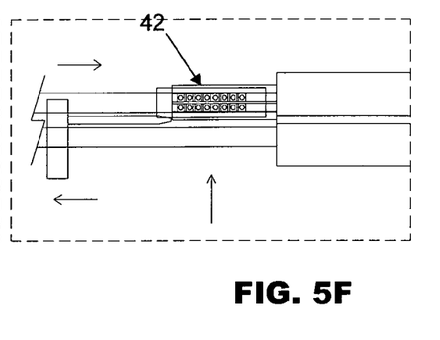

FIGS. 5A to 5F illustrate plan views (in the x-y axes) of the transfer of singulated packages 12 to a second preferred embodiment of the offloader in the form of an offload tube 44. In FIG. 5A, a buffer shutter 42 moves to a receiving position to receive the packages 12 from the pick heads 34, 36 after the packages 12 have been inspected by the ball inspection device 28. The pick heads 34, 36 alternately place the rows of packages 12 held thereon onto the buffer shutter 42. After the pick heads 34, 36 have moved away, the buffer shutter 42 moves in the y-direction to a position for transferring a first row of packages 12 into the offload tube 44. FIG. 5B shows a package ejector 46 in a first position ready to push a row of packages 12 into the offload tube 44. FIG. 5C shows the package ejector 46 in a second position after the first row of packages 12 has been pushed into the offload tube 44. The tube ejector 46 returns to its first position and the buffer shutter 42 moves in the y-direction to align the second row of packages 12 for the package ejector 46 to push the packages 12 into the offload tube 44 as shown in FIG. 5D. In FIG. 5E, the package ejector 46 pushes the second row of packages 12 into the offload tube 44. In FIG. 5F, the tube ejector 46 returns to its first position while the buffer shutter 42 moves to the receiving position and receives another two rows of packages 12 from the pick heads 34, 36. The two rows of packages 12 are pushed into the offload tube 44 one row after another by the package ejector 46. The procedures from FIGS. 5A to 5F are repeated.

Figure 6:
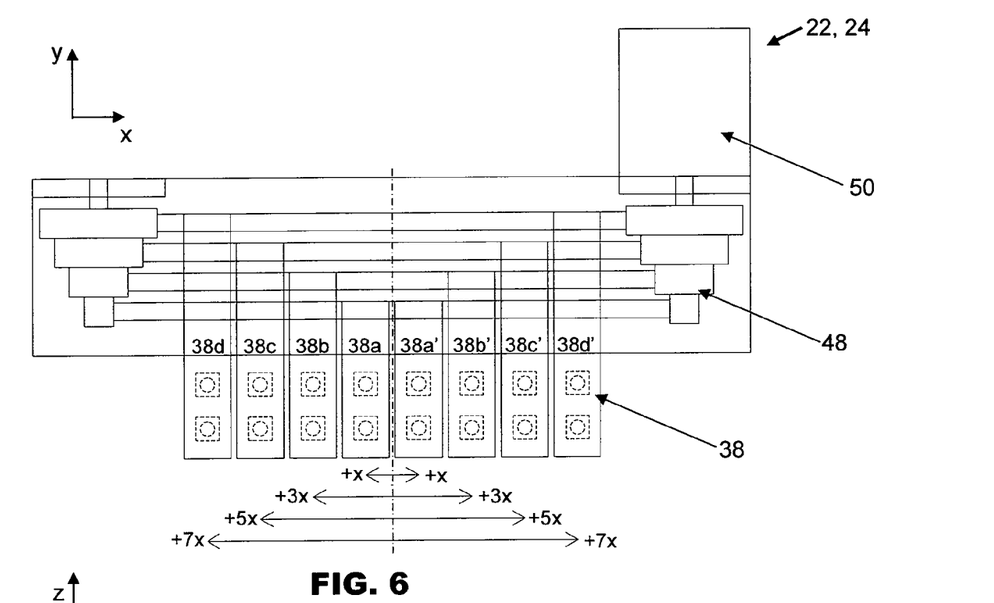
FIG. 6 is a plan view (in the x-y axes) of an automatic pitch adjustment offloading arm in a first configuration having one indexing motor according to a preferred embodiment of the invention.

FIG. 6 is a plan view (in the x-y axes) of an automatic pitch adjustment offloading arm 22, 24 in a first configuration having one indexing motor 50 according to a preferred embodiment of the invention. The dual offloading pick arms 22, 24 each comprises a driving mechanism in the form of an automatic pitch adjustment mechanism for driving the pick heads 34, 36 to move relative to one another in directions parallel to the length (L) of the row of pick heads 34, 36 for adjusting the pitch width (p) of the pick heads 34, 36. The driving mechanism comprises a pulley system which is made up of a pair of pulleys 48, each pulley 48 having two or more concentrically-arranged graduated steps of different diameters. Two or more timing belts 52 are separately connected to respective graduated steps of the pair of pulleys 48 so that each of the timing belts 52 has a different pulley ratio relative to another timing belt 52. In the illustrated first configuration, there are a total of four graduated steps and four belts connected to the four graduated steps. At least one pick head 34, 36 is mounted onto each timing belt 52, but two pick heads are preferably mounted onto each timing belt 52.

The offloading arm 22, 24 in the illustrated embodiment exhibits a matrix arrangement of two rows of vacuum pads 38 with the pitch in between the rows fixed in the y-direction. The pitch width p in between the vacuum pads 38 in the x-direction is adjustable and this pitch is programmed for automatic adjustment during package handling. The pitch width in the x-direction is controlled by the pair of pulleys 48 driven by the indexing motor 50.

Generally, the pulley ratio of each level of graduated step is 2n−1, where n represents an nth level of the graduated step. Therefore, the pulley ratio of a first level of the graduated step with the smallest diameter as compared to a second level of the graduated step of a next larger diameter is 1:3.

In the preferred embodiment of the invention where there are four levels of graduated steps, the pulley ratio is preferably <1:3:5:7> corresponding to the distance ratio of <the pair of vacuum pads 38a, 38a': the pair of vacuum pads 38b, 38b': the pair of vacuum pads 38c, 38c': the pair of vacuum pads 38d, 38d'>. That is, when the vacuum pads 38a, 38a' move a distance x in the respective direction, the pitch between the vacuum pads 38a, 38a' (inner pitch) will increase by 2x. To maintain an equal pitch with the vacuum pads 38a, 38a' after the vacuum pads 38a, 38a' move a distance x, the vacuum pads 38b, 38b' would have to move a distance of 3x (summation of the increase in the inner pitch 2x and the distance compensating for the movement of the adjacent vacuum head x). Therefore, the movement ratio between the vacuum pad 38a and the vacuum pad 38b (as well as the vacuum pad 38a' and the vacuum pad 38b') is 1:3. Likewise, the vacuum pads 38c, 38c' have to move a distance of 5x so that the movement ratio between the vacuum pad 38a and the vacuum pad 38c (and the vacuum pad 38a' and the vacuum pad 38c') will be 1:5. Similarly, the vacuum pads 38d, 38d' need to move a distance of 7x, so that the movement ratio between the vacuum pad 38a and the vacuum pad 38d (and the vacuum pad 38a' and the vacuum pad 38d') would be 1:7. As a result, the vacuum pads 38 are movable in the x-direction and the pitch width p between the pads 38 is adjustable by a single motor to achieve and maintain an equal pitch relationship between each pair of vacuum pads 38a, 38a'; 38b, 38b'; 38c, 38c'; and 38d, 38d'.

Figure 7:
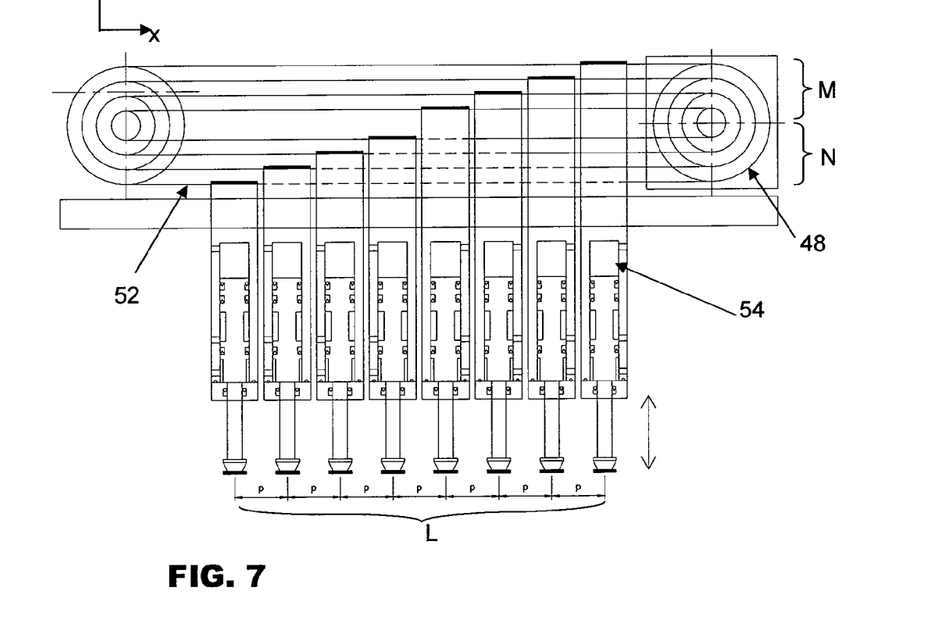
FIG. 7 is a side view (in the x-z axes) of the automatic pitch adjustment offloading arm of FIG. 6.

FIG. 7 is a side view (in the x-z axes) of the automatic pitch adjustment offloading arm 22, 24 of FIG. 6. Each timing belt 52 has two mounting parts M, N on opposite sides of the pair of pulleys 48, such that one pick head 34, 36 is mounted onto a mounting part M on one side of the pulleys 48 and another pick head 34, 36 is mounted onto another mounting part N on an opposite side of the pulleys 48, such that rotation of the pulleys 48 is operative to move the two pick heads 34, 36 in opposite directions at the same time. Hence in the preferred embodiment of the invention, the four leftmost vacuum pads 38 namely 38a, 38b, 38c, 38d are connected to the timing belt 52 on one side of the pulleys 48 while the four rightmost vacuum pads namely 38a', 38b', 38c' & 38d' are connected to the pulley timing belt 52 on the opposite side of the pulleys 48. As a result, the left group and the right group of vacuum pads 38 are movable in opposite directions at the same time in directions which are parallel to the length L of the row of pick heads 38 in the distance ratios as mentioned above to achieve pitch width (p) adjustment in the x-direction while maintaining an equal pitch relationship across all the vacuum pads 38. Each pair of vacuum pads 38 is driven separately by an air cylinder 54 along the z-direction such that each pair of vacuum pads 38 is movable individually.

Figure 8:
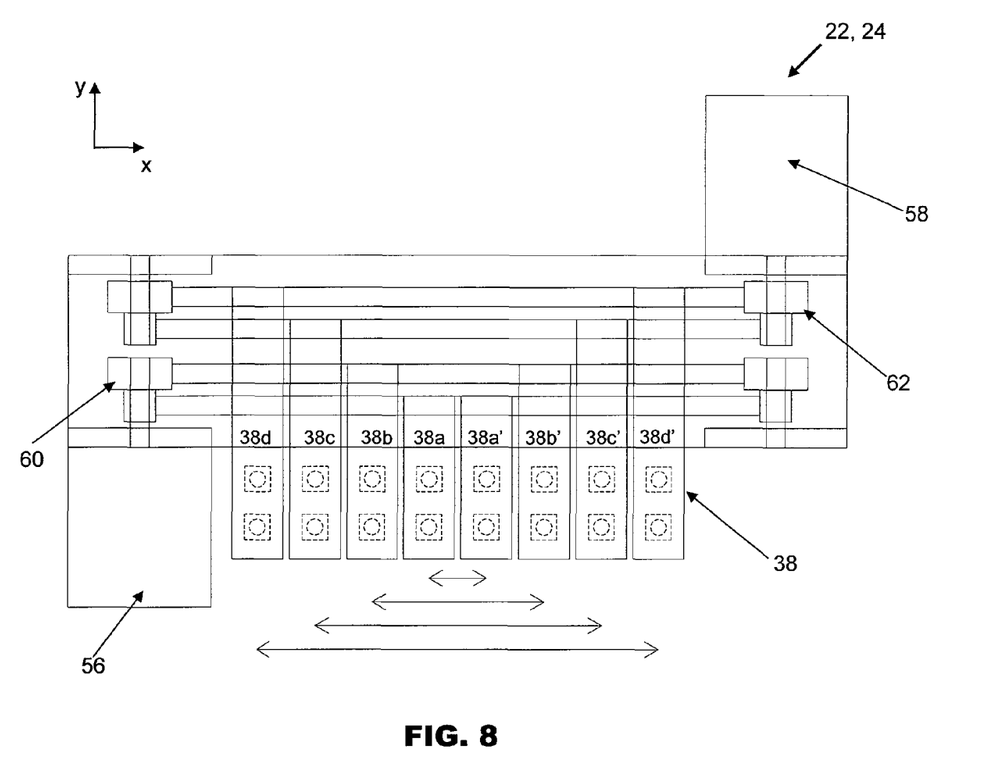
FIG. 8 is a plan view (in the x-y axes) of the automatic pitch adjustment offloading arm in a second configuration having dual indexing motors.

There is a possibility of losing the resolution and accuracy of positioning by the graduated steps of the pulleys 48 especially when the pulley ratio corresponding to the distance ratio of <the pair of vacuum pads 38a, 38a': the pair of vacuum pads 38d, 38d'> is substantially large such as 1:7. FIG. 8 is a plan view (in the x-y axes) of the automatic pitch adjustment offloading arm 22, 24 in a second configuration having dual indexing motors 56, 58. Incorporating the dual indexing motors 56, 58 into the automatic pitch adjustment offloading arm 22, 24 may help to avoid the foregoing problem and hence provides an increased resolution and accuracy of positioning of the graduated steps with larger diameters.

The first indexing motor 56 drives a first pair of pulleys 60 mounted with the four innermost vacuum pads 38a, 38a', 38b, 38b' while the second indexing motor 58 drives a second pair of pulleys 62 mounted with the four outermost vacuum pads 38c, 38c', 38d, 38d'. The first and second pair of pulleys 60, 62 each comprises two graduated steps, with each graduated step of the first and second pairs of pulleys 60, 62 having a different pulley ratio for driving the pick heads 34, 36 to move relative to one another.

The second indexing motor 58 covers more cycles to compensate for the lost of traveling in order to provide a more accurate positioning. In doing so, the second indexing motor 58 moves faster than the first indexing motor 56. For example, if the diameter of the first pair pulleys 60 for the vacuum pads 38a, 38a' and the vacuum pads 38c, 38c' are the same, the pulley ratio of the second pair of pulleys 62 for the vacuum pads 38c, 38c' and the vacuum pads 38d, 38d' would be 1:7/5, that is, 1:1.4. Therefore to maintain the pulley ratio of <1:3:5:7>, when the first indexing motor 56 turns one cycle, the second indexing motor 58 correspondingly turns five cycles to compensate for the distance moved by the vacuum pads 38c, 38c' and the vacuum pads 38d, 38d'.

It should be appreciated that the preferred embodiments of the invention as described above provide an apparatus and method for handling singulated packages such as BGA and QFN packages which permit full inspection of all the surfaces of the packages.

Simultaneous processing of multiple singulated packages 12 is possible, including package pick-up, mold surface inspection, ball and/or five sides inspection and offloading, which reduces cycle time. Additionally, the dual linear offloading arms 22, 24 permit simultaneous pick and place of one or more rows of packages 12 at a time by the vacuum pads 38. This is facilitated by the use of automatic pitch adjustment pick arms 22, 24 with programmable adjustment of the pitch between the pick heads 34, 36 of the pick arms in the x-direction to achieve and maintain the desired pitch between adjacent vacuum pads 38 to correspond with the pitch required for the buffer boats 18, 20, ball inspection device 28 and the offload tray 40 or tube 44 at the offloaders 30, 32. Furthermore, the automatic pitch adjustment pick arms 22, 24 can pick up more than one row of packages 12 each time, hence the moving speed of the pick arms in the x-direction will be less demanding. Additionally, the automatic pitch adjustment pick arms are less complex and being the main transfer module for the packages 12, the overall cost of the inspection apparatus 10 can be significantly reduced.

Further, the use of the ball inspection device 28 for inspection of the packages 12 permits simultaneous five-sides inspection of QFN packages. This reduces cycle time significantly. Another time-saving factor is provided by the gang précisor 26 which allows for simultaneous angular alignment of a row of packages 12, thus maintaining consistency in the orientation of the packages 12. The package hand-over frequency, excluding the transfer from the singulation jig and gang transfer and offloading to the offloaders 30, 32, is reduced substantially. Therefore, the reliability and stability of package handling is greatly improved.

Additionally, the package yield is increased significantly since simultaneous mold inspection, pick up and transfer of separate groups of the packages 12 are possible with the flexibility provided by the linear offloading arms 22, 24 and the dual buffer boats 18, 20. The cycle time per unit is reduced and thus a higher system throughput and productivity is achievable.

The package flipping feature provides a further advantage to the invention as flipping the packages 12 at an earlier part of the package handling process allows easier and more sturdy handling of the packages 12, since the flat bottom surfaces of the packages 12 are held instead of the ball side or upper side which typically has components mounted on it. The overall mechanism utilized is also less complex compared to the aforesaid prior art. The conversion parts are fewer, so that the overall cost of the system is reduced.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for transferring a plurality of electronic components, comprising a row of pick heads operative to pick up the electronic components simultaneously from a first location and to place them at a second location, and a driving mechanism operative to drive each of the pick heads to move relative to one another in directions which are parallel to a length of the row of pick heads whereby to adjust a pitch width of the pick heads;

a pulley system comprising a pair of pulleys, each pulley having two or more concentrically-arranged graduated steps of different diameters;

two or more belts separately connected to respective ones of the graduated steps of the pair of pulleys so that each of the belts has a different pulley ratio relative to another belt; and wherein at least one pick head is mounted onto each belt.

2. The apparatus as claimed in claim 1, wherein the pulley ratio of a first level of the graduated step with the smallest diameter as compared to a second level of the graduated step of a next larger diameter is 1:3.

3. The apparatus as claimed in claim 2, wherein the pulley ratio of each level of graduated step is 2n−1, where n represents an nth level of the graduated step.

4. The apparatus as claimed in claim 1, wherein each belt has two mounting parts on opposite sides of the pair of pulleys, and one pick head is mounted onto a mounting part on one side of the pulleys and another pick head is mounted onto another mounting part on an opposite side of the pulleys, such that rotation of the pulleys is operative to move the two pick heads in opposite directions at the same time.

5. The apparatus as claimed in claim 1, wherein the pulley system comprises first and second pairs of pulleys, and further comprises a first indexing motor for driving the first pair of pulleys and a second indexing motor for driving the second pair of pulleys by different distances.

6. The apparatus as claimed in claim 5, wherein the first pair of pulleys and the second pair of pulleys comprise multiple graduated steps, each having a different pulley ratio for driving the pick heads to move relative to one another.

7. The apparatus as claimed in claim 1, wherein each pick head contains at least two vacuum pads so that the row of pick heads is operative to pick up at least two rows of electronic components.

* * * * *